(12) United States Patent
Bulovic

(10) Patent No.: US 10,270,202 B2
(45) Date of Patent: Apr. 23, 2019

(54) POWER ELECTRONIC ARRANGEMENT COMPRISING A COMMUNICATION DEVICE

(71) Applicant: SEMIKRON ELEKTRONIK GMBH & CO. KG, Nuremberg (DE)

(72) Inventor: Sandro Bulovic, Fürth (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/957,525

(22) Filed: Apr. 19, 2018

(65) Prior Publication Data

US 2018/0337487 A1    Nov. 22, 2018

(30) Foreign Application Priority Data

May 16, 2017   (DE) .......................... 10 2017 110 595

(51) Int. Cl.
*H01R 12/00* (2006.01)
*H01R 13/52* (2006.01)
(Continued)

(52) U.S. Cl.
CPC ..... *H01R 13/5202* (2013.01); *H01R 12/7011* (2013.01); *H01R 12/716* (2013.01);
(Continued)

(58) Field of Classification Search
CPC .............. H01R 12/7011; H01R 12/714; H01R 12/716; H01R 13/5202; H01R 13/5216;
(Continued)

(56) References Cited

U.S. PATENT DOCUMENTS

| 4,105,278 A | * | 8/1978 | Braund ................ H01R 13/504 |
| | | | 439/460 |
| 4,259,156 A | * | 3/1981 | Neuenfeldt .......... G21C 13/032 |
| | | | 376/262 |

(Continued)

FOREIGN PATENT DOCUMENTS

DE          10200494          9/2002

OTHER PUBLICATIONS

DE 10 2017 110 595.6, Examination Report dated Feb. 2, 2018, 3 pages—English, 6 pages—German.

*Primary Examiner* — Abdullah A Riyami
*Assistant Examiner* — Vladimir Imas
(74) *Attorney, Agent, or Firm* — Lackenbach Siegel, LLP; Andrew F. Young

(57) ABSTRACT

The invention presents a power electronic arrangement comprising a power electronic switching device, a printed circuit board for carrying control signals for driving the power electronic switching device, a housing which covers the printed circuit board, a communication device which is arranged on the printed circuit board and is accessible through a recess in the housing, and comprising a sealing device, wherein the sealing device has a sealing section which rests in a sealing manner on a first sealing face of the communication device, and wherein the sealing device has a first and second sealing lip which are each arranged circumferentially around and at a distance from the communication device, wherein the two sealing lips are connected to one another by a web and both rest on a second sealing face of the printed circuit board, and wherein the housing has a wall-like pressure device which presses on the web and in this way the first sealing lip bears against that side of the pressure device which faces the communication device, and the second sealing lip bears against that side of (Continued)

the pressure device which is averted from the communication device.

8 Claims, 3 Drawing Sheets

(51) Int. Cl.
    *H05K 5/06*         (2006.01)
    *H01R 12/70*       (2011.01)
    *H01R 12/71*       (2011.01)
    *H05K 1/18*         (2006.01)
    *H05K 5/00*         (2006.01)

(52) U.S. Cl.
    CPC ......... *H01R 13/5216* (2013.01); *H05K 1/181* (2013.01); *H05K 5/0026* (2013.01); *H05K 5/06* (2013.01); *H05K 5/061* (2013.01); *H05K 5/063* (2013.01); *H01R 12/714* (2013.01); *H05K 2201/10189* (2013.01); *H05K 2201/10325* (2013.01)

(58) Field of Classification Search
    CPC ........ H05K 1/181; H05K 5/0026; H05K 5/06; H05K 5/061; H05K 5/063; H05K 2201/10189; H05K 2201/10325
    USPC ........................................................ 439/76.1
    See application file for complete search history.

(56) References Cited

U.S. PATENT DOCUMENTS

| | | | | |
|---|---|---|---|---|
| 5,720,621 A * | 2/1998 | Austin | ............... | H01R 13/2442 439/76.1 |
| 5,975,369 A * | 11/1999 | Yurkewicz | ............. | B65D 41/32 215/251 |
| 6,044,628 A * | 4/2000 | Katayama | ............ | B29C 65/3656 53/552 |
| 6,179,658 B1 * | 1/2001 | Gunay | ............... | H01R 13/5216 439/272 |
| 6,616,480 B2 * | 9/2003 | Kameyama | .......... | H01R 13/521 439/271 |
| 6,634,910 B2 * | 10/2003 | Lieb | ..................... | H05K 7/1465 439/271 |
| 6,739,893 B2 * | 5/2004 | Hallitschke | .......... | H05K 5/0069 439/248 |
| 7,094,104 B1 * | 8/2006 | Burke | .................... | H01R 24/42 439/620.01 |
| 7,149,089 B2 * | 12/2006 | Blasko | ................. | H01R 13/521 361/752 |
| 7,201,585 B2 * | 4/2007 | Pirner | .................... | B60T 8/3675 303/119.3 |
| 7,291,036 B1 * | 11/2007 | Daily | ................. | H05K 7/20445 439/487 |
| 7,331,801 B1 * | 2/2008 | Eichorn | .................... | H01R 12/724 439/76.1 |
| 7,599,189 B2 * | 10/2009 | Nishimoto | ............ | B60T 8/3675 361/752 |
| 7,704,080 B2 * | 4/2010 | Naumann | .................. | B25F 5/02 439/276 |
| 7,841,869 B2 * | 11/2010 | Yamaguchi | .......... | H01R 13/521 439/589 |
| 8,946,566 B2 * | 2/2015 | Baker | .................... | H05K 3/284 174/521 |
| 9,722,336 B2 * | 8/2017 | Cooney | ............... | H01R 13/5202 |
| 2015/0099385 A1 * | 4/2015 | Ikeya | .................... | H01R 12/724 439/271 |
| 2017/0194736 A1 * | 7/2017 | Greene | ................ | H01R 13/521 |

* cited by examiner

POWER ELECTRONIC ARRANGEMENT COMPRISING A COMMUNICATION DEVICE

CROSS REFERENCE TO RELATED APPLICATION

This application relates to, and claims priority from, Ser. No.: DE 10 2017 110 595.6 filed May 16, 2017, the entire contents of which are incorporated herein by reference.

BACKGROUND OF THE INVENTION

Field of the Invention

The present invention relates to a power electronic arrangement comprising a power electronic switching device, a printed circuit board for carrying control signals for driving the power electronic switching device, a housing which covers the printed circuit board, a communication device which is arranged on the printed circuit board and is accessible through a recess in the housing, wherein the recess, together with the communication device, is sealed off against the ingress of contaminants (dust, dirt, moisture and liquid).

Description of the Related Art

It is known, by way of example, from the generally known prior art to design a communication device of this kind as a D-sub socket or plug. It is further known to seal off a recess with commercially available D-sub sockets or plugs arranged therein by means of an encapsulation compound. As an alternative, it is generally known to design D-sub sockets and plugs with a seal bearing against them.

Accordingly, there is a need for an improved power electronic arrangement comprising a communication device with at least one of the improvements noted herein.

ASPECTS AND SUMMARY OF THE INVENTION

The present invention is based on the alternative and adaptive object of presenting a power electronic arrangement in which a communication device is connected to a printed circuit board and is additionally accessible through a recess in a housing, wherein the communication device itself does not have an integral sealing device and, when a sealing device is provided for sealing off the recess, no pressure or only slight pressure is exerted onto the printed circuit board.

According to the invention, this adaptive object is achieved by a power electronic arrangement having the features included in the claims.

The power electronic arrangement according to the invention is designed with a power electronic switching device, a printed circuit board for carrying control signals for driving the power electronic switching device, a housing which covers the printed circuit board, a communication device which is arranged on the printed circuit board and is accessible through a recess in the housing, and with a sealing device, wherein the sealing device has a sealing section which rests in a sealing manner on a first sealing face of the communication device, and wherein the sealing device has a first and second sealing lip which are each arranged circumferentially around and at a distance from the communication device, wherein the two sealing lips are connected to one another, preferably centrally, by a web and both rest on a second sealing face of the printed circuit board, and wherein the housing has a wall-like pressure device which presses on the web and in this way the first sealing lip bears against that side of the pressure device which faces the communication device, and the second sealing lip bears against that side of the pressure device which is averted from the communication device. It will be noted that the pressure device likewise presses on the web circumferentially around the communication device.

It is particularly advantageous when the sealing device is formed from a material from amongst the group of materials comprising elastomers, in particular based on silicone rubber, in particular with a Shore A hardness of between 15 and 30, preferably of between 20 and 25.

It is further advantageous when the housing is formed from a material from amongst the group of materials comprising thermoplastics, in particular polycarbonates.

The communication device is preferably in the form of a display device or in the form of a plug-in connecting device, in particular in the form of a D-sub socket or plug in accordance with standard IEC-807-2.

It is particularly preferred when the first sealing face of the first plug-in connecting device is designed, in combination with the sealing section and a sealing edge of a second plug-in connecting device, which forms a plug-in connection together with the first plug-in connecting device, to seal off this plug-in connection against the ingress of contaminants (dust, dirt, moisture and liquid), wherein the alternatives can also be fulfilled in any desired combinations.

It is preferred here when the second plug-in connecting device is in the form of a D-sub plug or D-sub socket analogously to the first plug-in connecting device.

It will be understood that adaptively the features, in particular the communication device and also the recess which is associated with it, which are referred to in the singular can be present multiple times in the arrangement according to the invention, unless this is explicitly precluded or precluded per se or is inconsistent with the concept of the invention.

It goes without saying that the different refinements of the invention can be realized individually or in any desired combinations in order to achieve improvements. In particular, the features mentioned and explained above and hereinafter can be used not only in the combinations indicated, but also in other combinations, or by themselves, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
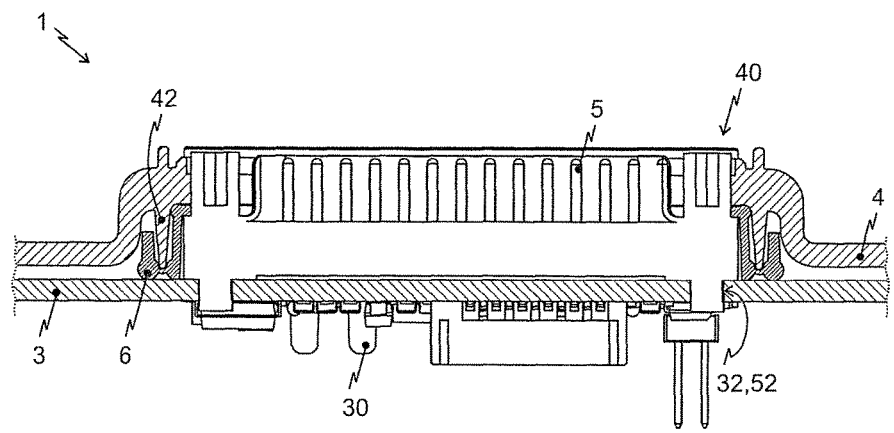
FIG. 1 shows a partial sectional side view of a first detail of a first power electronic arrangement.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "an embodiment", "variants," and "one/the embodiment/variant," or "one version," "a version" and the like, should be understood to mean that a particular feature, structure, or characteristic described in connection with the variant or version is included in at least one such embodiment or variant or version according to the disclosure. Thus, the appearances of elements in one embodiment, version, or variant will be understood to be adaptively applicable to other embodiments, versions, or variants and that one embodiment does not necessarily refer to the same embodiment, version or variant. Nor are separate or alternative versions or variants mutually exclusive of other versions or variants. Moreover, various features may be described which possibly may be exhibited by some variants or versions and not by others.

Various operations may be described as multiple discrete operations in turn, in a manner that may be helpful in understanding embodiments of the present invention; however, the order of description should not be construed to imply that these operations are order dependent.

FIG. 1 shows a side view of a detail of a first power electronic arrangement 1. The figure illustrates a printed circuit board 3, having a plurality of components 30, for carrying control signals for driving a power electronic switching device, not illustrated. The figure further illustrates a D-sub plug 5 which is conventional in the art and is directly connected to the printed circuit board 3 in a mechanical manner, by means of holding devices 52 which are arranged in recesses 32 in the printed circuit board 3, and in an electrical manner as is conventional in the art, and which forms a communication device of this power electronic arrangement 1. In principle, a display device, for example in the form of a display for displaying operating functions, could be provided as a communication device instead of The D-sub plug.

What is important is that the communication device 5 is accessible from the outside. To this end, the printed circuit board 3 is covered by a housing 4 which has a recess 40 in which the communication device 5 is arranged.

In order to seal off the recess 40 in the housing 4 with the provided communication device 5, in particular with respect to the printed circuit board 3, preferably in accordance with IP67, but at least in accordance with IP55, a sealing device 6 is provided according to the invention. The sealing device 6 has, also see FIGS. 2 to 4 for details, a sealing section 60 which rests in a sealing manner on a first sealing face 50 of the communication device 5. The sealing device 6 itself is formed from a silicone rubber with a Shore A hardness of 21. It will be understood that other Shore A hardness may be used sufficient to accomplish the goals of the present invention, so that the present invention is understood to disclose Shore A hardnesses of other amounts and is not limited to a Shore A hardness of 21.

For the purpose of sealing off between the housing 4, which is composed of polycarbonate, and the printed circuit board 3, The sealing device 6 has a first sealing lip 62, which is arranged completely circumferentially around and respectively at a distance from the communication device 5, and a second sealing lip 64, which is arranged laterally circumferentially at a further distance from the communication device 5. These sealing lips 62, 64 are connected to one another in an integral manner by means of a likewise completely circumferential web 66. Furthermore, the two sealing lips 62, 64 rest on the printed circuit board 3, while the web 66 which runs parallel to the printed circuit board 3 is at a distance from the printed circuit board.

In order to form at the seal, the housing 3 likewise has a wall-like pressure device 42 completely circumferentially around the communication device 5. This pressure device 42, at least the relevant part thereof, surrounds the communication device 3 at a distance of the web 66 and presses said web. In the process, the two sealing lips 62, 64 are each pressed laterally against the wall-like pressure device 42 owing to the elastic design of the sealing device 6, in particular of the web 66 here. Therefore, in the process, the first sealing lip 62 bears against that side of the pressure device 42 which faces the communication device 5, while the second sealing lip 64 bears against that side of the pressure device 42 which is averted from the communication device 5.

Figure 2:
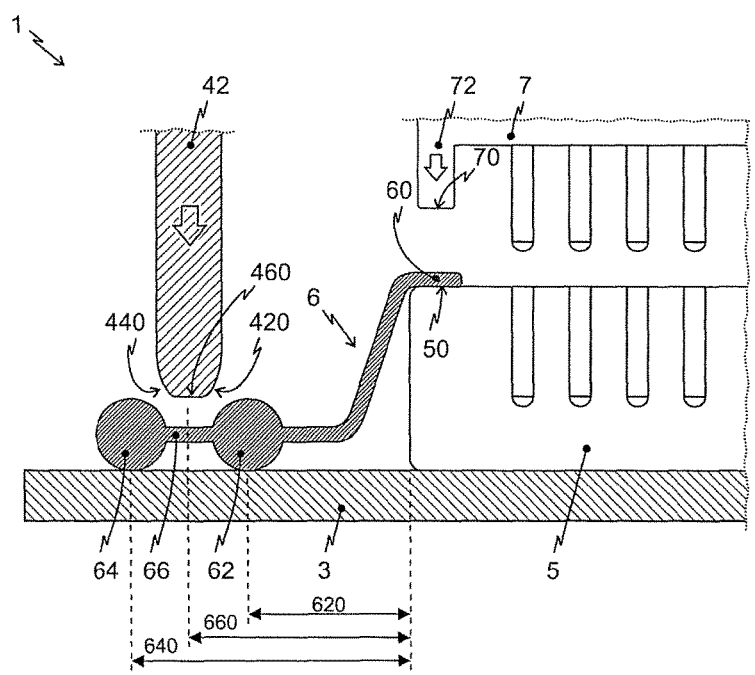
FIG. 2 schematically shows a partial sectional exploded illustration of a detail of a second power electronic arrangement.

FIG. 2 schematically shows a partially exploded illustration of a detail of a second power electronic arrangement 1. The figure again illustrates a printed circuit board 3 comprising a communication device 5 in the form of a D-sub socket which is conventional in the art and is electrically and mechanically connected to the printed circuit board 3 in a manner which is conventional in the art. The figure further illustrates a portion of the housing 4, here a portion of the pressure device 42 which is in the form of a wall which surrounds the D-sub socket and has a pressure face 460 parallel to the printed circuit board and two side faces 420, 440 perpendicular to or forming at an angle of more than 70° with the conductor track.

The sealing device 6, once again composed of a silicone rubber, has two cylindrical sealing lips 62, 64 which are arranged circumferentially around and at a distance from the communication device 5 and which are connected to one another centrally, that is to say at half the height above the printed circuit board 3, by means of a web 66, wherein the web 66 runs parallel to the printed circuit board 3 in the state in which pressure is not applied. The first sealing lip 62 surrounds the communication device 5 at a first distance 620, while the sealing device 42 and therefore also the web 66 surround the communication device 5 at a second greater distance 660 and parallel to the first sealing lip 62. The second sealing lip 64 surrounds the communication device 5 at a third, yet greater distance 660.

The sealing device 6 further has a sealing section 60 which rests in a sealing manner on a first sealing face 50 of the communication device 5 and which is integrally connected to the first sealing lip 62. Here, purely by way of example, this sealing lip 50 is arranged parallel to the printed circuit board 3. It may also be preferred when the sealing face is provided laterally on the communication device, that is to say perpendicular to the printed circuit board.

As illustrated here, it may be additionally preferred when the first sealing face 50 of the first plug-in connecting device is designed, in combination with the sealing section 72 and a sealing edge 70 of a second plug-in connecting device 7 which is in the form of a D-sub plug and forms a plug-in connection together with the first plug connecting device 5, to seal off The plug-in connection against the ingress of contaminants (dust, dirt, moisture or liquid).

Figure 3:
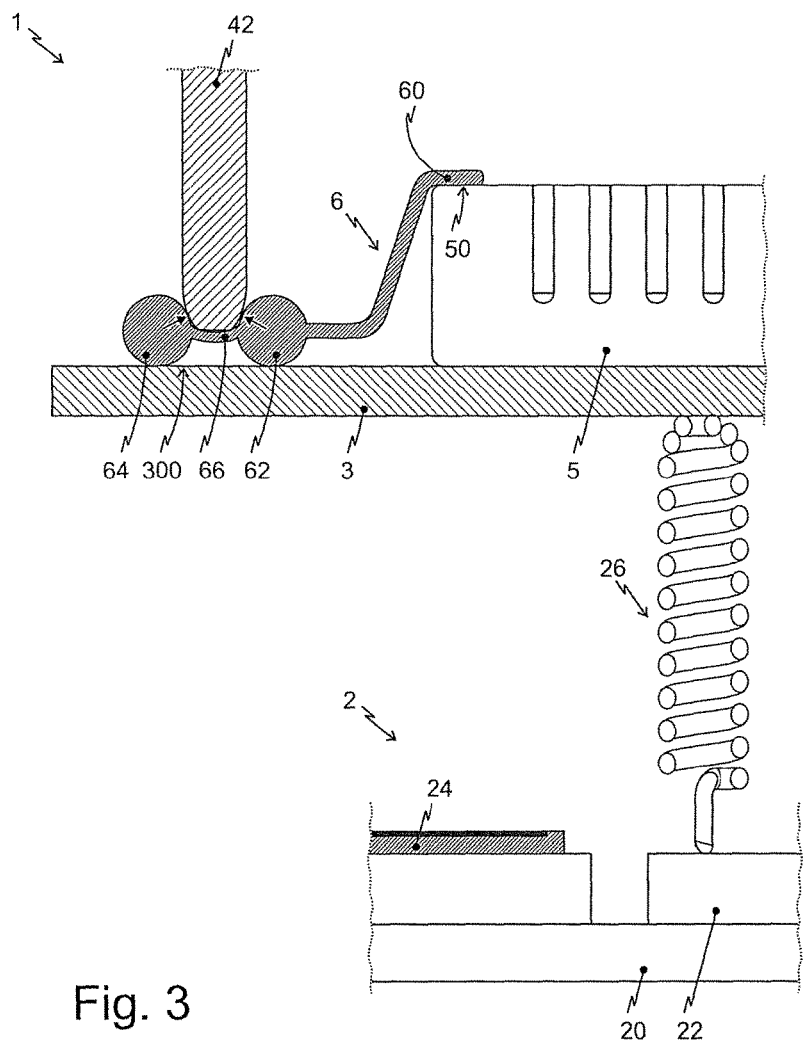
FIG. 3 shows a normal partial cross sectional assembly illustration of a second power electronic arrangement.

FIG. 3 shows the second power electronic arrangement 1 in a normal illustration without the second plug-in connecting device but with a power electronic switching device 2 which, here, is in the form of a substrate comprising an insulating-material body 20 and conductor tracks 22 with a power semiconductor component 24 arranged thereon. One of the conductor tracks 22 is electrically conductively connected to the printed circuit board 3 by means of an auxiliary connection element 26 which carries a control current and is in the form of a contact spring. Further details of the switching device 2 are designed in a manner which is conventional in the art and are not illustrated here.

The illustration particularly shows the pressure effect of the pressure device 42 on the web 66 of the sealing device 6, which web is bent in the direction of the printed circuit board 3 in this way. This bending causes the first sealing lip 62 to bear against that side 420, cf. FIG. 2, of the pressure device 42 which faces the communication device 5, illustrated by an arrow in the first sealing lip 62. At the same time, this bending causes the second sealing lip 64 to bear against that side 440, cf. FIG. 2, of the pressure device 42 which is averted from the communication device 5, illustrated by an arrow in the second sealing lip 64. This bearing against the two sides 420, 440 of the sealing device 42 provides outstanding sealing off, wherein only minimal pressure is exerted onto a second sealing face 300 of the printed circuit board 3. The pressure effect on the second sealing face 300 of the printed circuit board 3 is at least so low that damage to the printed circuit board is precluded in this way.

Figure 4:
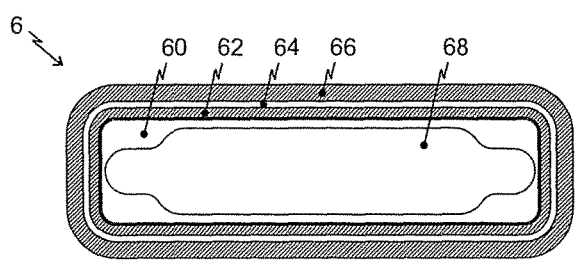
FIG. 4 shows a plan view of a sealing device of the first power electronic arrangement.

FIG. 4 shows a plan view of a sealing device of the first power electronic arrangement 1. The figure illustrates a recess 68 for a communication device, here a D-sub plug, and also a sealing section 60 which is designed to come to rest in a sealing manner on a first sealing face of the D-sub plug. This forms a first part of the seal of the recess in the housing, also cf. FIGS. 1 to 3.

The figure further illustrates the two circumferential sealing lips 62, 64, and also the web 66 which connects them. The two sealing lips 62, 64 form, with the pressure device of the housing, cf. FIGS. 1 to 3, the second part of the seal of the recess in the housing.

Figure 5:
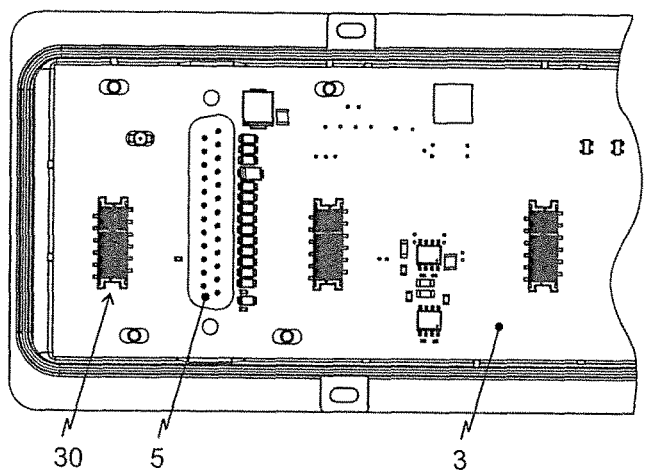
FIGS. 5 to 7 show various further views of details of the first power electronic arrangement, as discussed herein.
Figure 6:
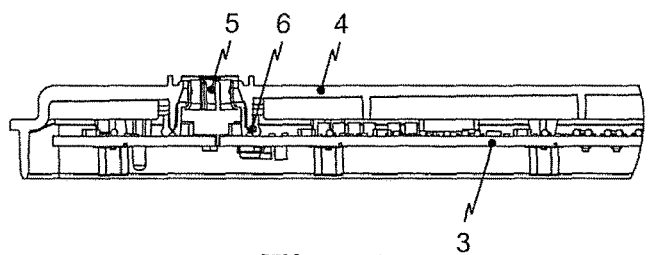
Figure 7:
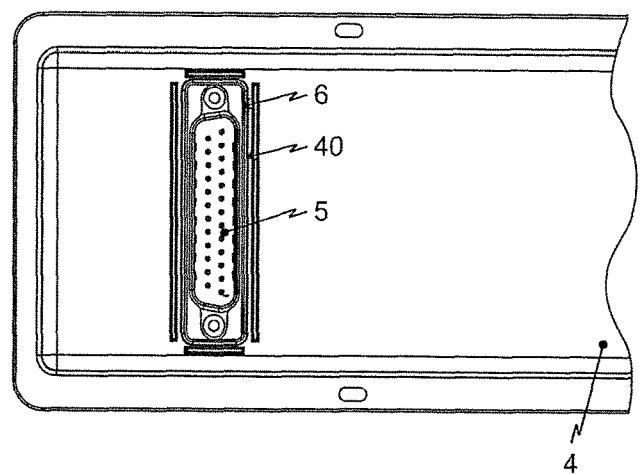

FIGS. 5 to 7 show various further views of details of the first power electronic arrangement 1. FIG. 5 shows a plan view of a printed circuit board 3 with a plurality of components 30 without the housing. The printed circuit board 3 serves to process and carry control signals for driving a power electronic switching device, not illustrated. The figure further illustrates a D-sub plug 5 which is conventional in the art and is mechanically fastened on the circuit board 3 and is electrically connected to conductor tracks of the printed circuit board 3.

FIG. 6 shows, comparably to FIG. 1, a sectional view, but with the housing 4 and the sealing device 6.

FIG. 7 shows a plan view, as in FIG. 5, but with the housing 4 and the sealing device 6.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic arrangement, comprising:
   a power electronic switching device;
   a printed circuit board for carrying control signals for driving the power electronic switching device;
   a housing which covers the printed circuit board;
   a communication device which is arranged on the printed circuit board and is accessible through a recess in the housing; and further comprising:
   a sealing device, wherein the sealing device has a sealing section which rests in a sealing manner on a first sealing face of the communication device;
   the sealing device has a first and a second sealing lip which are each arranged circumferentially around and at a distance from the communication device;
   the two sealing lips are connected to one another by a web and both rest on a second sealing face (300) of the printed circuit board;
   wherein the housing has a wall-like pressure device which presses on the web and urges the first sealing lip to bear against that side of the pressure device which faces the communication device, and urges the second sealing lip to bears against a side of the pressure device which is averted from the communication device.

2. The power electronic arrangement, according to claim 1, wherein:
   the sealing device is formed of an elastomer material having a Shore A hardness between 15 and 30.

3. The power electronic arrangement, according to claim 1, wherein:
   the housing is formed from a material amongst a group of materials comprising thermoplastics, in particular polycarbonates.

4. The power electronic arrangement, according to claim 1, wherein:
   the communication device is in the form of a display device.

5. The power electronic arrangement, according to claim 1, wherein:
   the communication device is in the form of a first plug-in connecting device.

6. The power electronic arrangement, according to claim 5, wherein:
   the first plug-in connecting device is in the form of a D-sub socket or D-sub plug.

7. The power electronic arrangement, according to claim 5, wherein:
   the first sealing face of the first plug-in connecting device is designed, in combination with the sealing section and a sealing edge of a second plug-in connecting device, which forms a plug-in connection together with the first plug-in connecting device, to seal off said plug-in connection against an ingress of a contaminant.

8. The power electronic arrangement, according to claim 7, wherein:
the second plug-in connecting device is in the form of a D-sub plug or D-sub socket.

* * * * *